(12) United States Patent
Schmenn et al.

(10) Patent No.: US 12,218,084 B2
(45) Date of Patent: Feb. 4, 2025

(54) OVERVOLTAGE PROTECTION DEVICE WITH TRENCH CONTACT

(71) Applicant: Infineon Technologies AG, Neubiberg (DE)

(72) Inventors: Andre Schmenn, Sachsenkam (DE); Isabella Goetz, Bodenwoehr (DE); Egle Tylaite, Munich (DE)

(73) Assignee: Infineon Technologies AG, Neubiberg (DE)

( * ) Notice: Subject to any disclaimer, the term of this patent is extended or adjusted under 35 U.S.C. 154(b) by 398 days.

(21) Appl. No.: 17/702,342

(22) Filed: Mar. 23, 2022

(65) Prior Publication Data

US 2023/0307388 A1   Sep. 28, 2023

(51) Int. Cl.
  *H01L 23/62*   (2006.01)
  *H01L 27/02*   (2006.01)

(52) U.S. Cl.
  CPC .......... *H01L 23/62* (2013.01); *H01L 27/0248* (2013.01)

(58) Field of Classification Search
  CPC . H01L 23/62; H01L 27/0248; H01L 27/0259; H01L 27/0255; H01L 29/868
  See application file for complete search history.

(56) References Cited

U.S. PATENT DOCUMENTS

| | | |
|---|---|---|
| 8,766,415 B2 | 7/2014 | Schmenn et al. |
| 10,622,346 B2 | 4/2020 | Schmenn et al. |
| 10,741,548 B2 | 8/2020 | Vendt et al. |
| 2010/0006889 A1* | 1/2010 | Marreiro ............ H01L 27/0255 257/106 |
| 2010/0090306 A1* | 4/2010 | Salih ................... H01L 29/866 257/E27.024 |
| 2010/0314660 A1* | 12/2010 | Salih ................... H01L 29/861 257/E27.024 |
| 2011/0266592 A1* | 11/2011 | Hawe .................. H01L 29/866 257/E21.532 |
| 2015/0084162 A1* | 3/2015 | Davis ................. H01L 29/8611 438/510 |
| 2016/0300827 A1 | 10/2016 | Vendt et al. |
| 2019/0123037 A1 | 4/2019 | Holland et al. |
| 2020/0111777 A1 | 4/2020 | Chen et al. |
| 2022/0254872 A1* | 8/2022 | Park ........................ H01G 4/38 |

* cited by examiner

*Primary Examiner* — Nduka E Ojeh
(74) *Attorney, Agent, or Firm* — Murphy, Bilak & Homiller, PLLC

(57) ABSTRACT

An overvoltage protection device includes a semiconductor body including a substrate region disposed beneath an upper surface of the semiconductor body, first and second contact pads disposed over the upper surface of the semiconductor body, a trenched connector formed in the semiconductor body, a vertical voltage blocking device formed in the semiconductor body, wherein the trenched connector includes a trench that is formed in the upper surface of the semiconductor body and extends to the substrate region, and a metal electrode disposed within the trench, wherein the metal electrode forms an electrically conductive connection between the first contact pad and the substrate region, and wherein the voltage blocking device is connected between the second contact pad and the substrate region.

20 Claims, 7 Drawing Sheets

OVERVOLTAGE PROTECTION DEVICE WITH TRENCH CONTACT

TECHNICAL FIELD

The instant application relates to semiconductor devices, and more particularly relates to overvoltage protection devices.

BACKGROUND

Components such as transistors, diodes, resistors, electro-optical devices, precision film resistors and a variety of integrated circuits are all sensitive to electrostatic discharge (ESD). As electronics manufacturers drive to miniaturize devices and improve operating speeds, vulnerability of devices to ESD is increasing. Devices are subject to ESD damage at every stage of production. For avoiding damage to integrated circuits or electronic devices by pulses during assembly or operation, ESD protection devices are connected between pins of an integrated circuit to prevent a malfunction or breakdown of circuits. ESD protection devices operate by maintaining a voltage within a safe operation range and becoming conductive to clamp a voltage that falls outside of the safe operation range.

Some ESD applications are very susceptible to negative ESD strikes and require low clamping voltages in the negative polarity, while requiring a relatively higher clamping voltage in the positive polarity. These ESD applications may require the ESD protection device to have low parasitic capacitance and/or small device footprint and/or low production cost. Conventional ESD protection solutions for meeting these goals come with conflicting tradeoffs. Accordingly, there is a need to provide an ESD protection device with the lowest possible parasitic capacitance, smallest possible package footprint, and lowest cost.

SUMMARY

Those skilled in the art will recognize additional features and advantages upon reading the following detailed description, and upon viewing the accompanying drawings.

An overvoltage protection device is disclosed. According to an embodiment, the overvoltage protection device comprises a semiconductor body comprising a substrate region disposed beneath an upper surface of the semiconductor body, first and second contact pads disposed over the upper surface of the semiconductor body, a trenched connector formed in the semiconductor body, a vertical voltage blocking device formed in the semiconductor body, wherein the trenched connector comprises a trench that is formed in the upper surface of the semiconductor body and extends to the substrate region, and a metal electrode disposed within the trench, wherein the metal electrode forms an electrically conductive connection between the first contact pad and the substrate region, and wherein the voltage blocking device is connected between the second contact pad and the substrate region.

According to another embodiment, the overvoltage protection device comprises a semiconductor body comprising a substrate region disposed beneath an upper surface of the semiconductor body; first and second contact pads disposed over the upper surface of the semiconductor body; a trenched connector electrically connected between the first contact pad and the substrate region; and a unidirectional voltage clamping device formed in the semiconductor body and connected between the second contact pad and the substrate region.

According to another embodiment, the overvoltage protection device comprises: a semiconductor body comprising a base region and a plurality of semiconductor mesas disposed on an upper surface of the base region; first and second contact pads disposed on upper surfaces of separate ones of the semiconductor mesas; a plurality of doped regions formed at lower surfaces of the semiconductor mesas, the lower surfaces of the semiconductor mesas facing the base region; and a plurality of trenched connectors formed in the semiconductor mesas, wherein each of the trenched connectors comprise a trench that is formed in an upper surface of the semiconductor mesas and extends to the base region, a metal electrode disposed within the trench, and a doped sidewall region lining sidewalls of the trench, wherein the doped regions and the trenched connectors collectively form a first voltage blocking device between the first and second contact pads.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of an overvoltage protection device that comprises a voltage blocking device and a trenched connector formed within a semiconductor body are described herein. The voltage blocking device may be configured as an ESD protection device that allows an applied potential between the first and second contact pads to deviate within a defined voltage range while clamping the applied potential if it falls outside the allowable voltage range. According to an embodiment, the voltage blocking device is a vertical voltage blocking device that is connected between the first contact pad and a substrate region of the semiconductor body, and the trenched connector provides an electrical connection between the substrate region and the second contact pad. This arrangement facilitates a vertical diode structure and the performance benefits flowing therefrom in a chip-scale package at low cost and with low area consumption.

Separately or in combination, a semiconductor device that comprises a trenched connector formed within a semiconductor body is described herein. The trenched connector may comprise a metal electrode disposed within a trench and a doped sidewall region lining sidewalls of the trench. The metal electrode may form a conductive connection between a subjacent semiconductor region and a contact pad disposed on a surface of the semiconductor body. According to an embodiment, the doped sidewall region forms part of an active device region, e.g., anode, cathode, emitter, collector, etc., of an active semiconductor device. This arrangement allows for an operational current of the active semiconductor device to flow in multiple directions, i.e., in a lateral direction and in a vertical direction. As a result, important device parameters such as capacitance, resistance, and area consumption can be improved.

Figure 1:
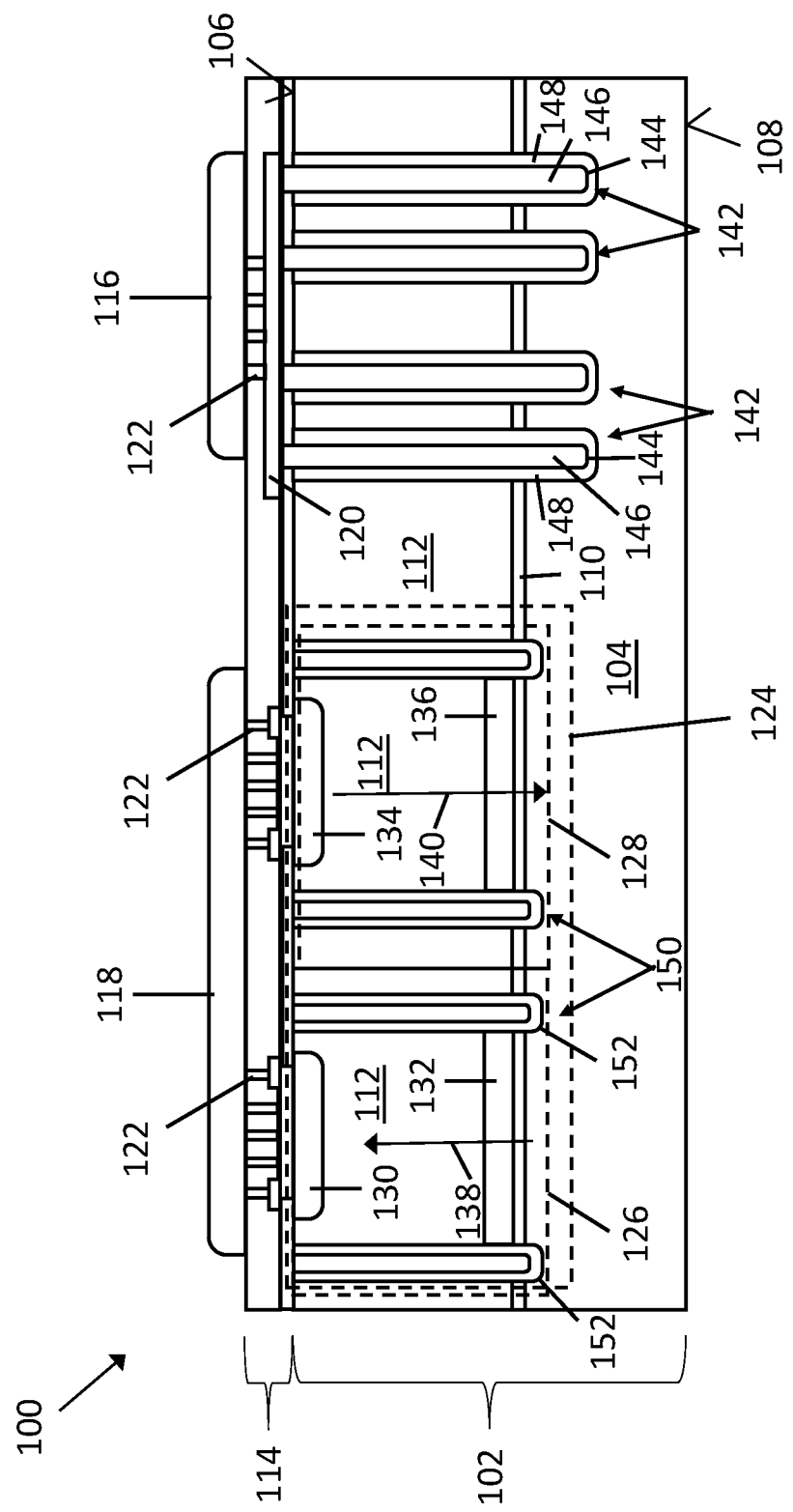
FIG. 1 depicts a cross-sectional view of an overvoltage protection device, according to an embodiment.

Referring to FIG. 1, an overvoltage protection device 100 is shown, according to an embodiment. The overvoltage protection device 100 is formed in a semiconductor body 102. The semiconductor body 102 may generally comprise standard semiconductor materials. According to an embodiment, the semiconductor body 102 is a silicon-based semiconductor body.

The semiconductor body 102 comprises a substrate region 104 disposed beneath an upper surface 106 of the semiconductor body 102. The substrate region 104 can correspond to a bulk substrate, such as a silicon wafer, that is used to form epitaxial material thereon. The substrate region 104 can have a first conductivity type (e.g., n-type), and can be highly doped, e.g., having a net dopant concentration of between $10^{18}$ dopant atoms/cm$^3$ and $10^{20}$ dopant atoms/cm$^3$. As shown, the substrate region 104 may extend to a rear surface 108 of the semiconductor body 102 that is opposite from the upper surface 106. Alternatively, the substrate region 104 may be provided over another part of the semiconductor body 102 (not shown).

The semiconductor body 102 comprises a buried layer 110 and a low-doped region 112. The buried layer 110 is arranged between the substrate region 104 and the low-doped region 112. The low-doped region 112 is arranged between the buried layer 110 and the upper surface 106 of the semiconductor body 102. The buried layer 110 may have the same first conductivity type as the substrate region 104 (e.g., n-type). The buried layer 110 may have a net dopant concentration that is lower than the substrate region 104. For example, the buried layer 110 may have a net dopant concentration of between $10^{15}$ dopant atoms/cm$^3$ and $10^{18}$ dopant atoms/cm$^3$. The low-doped region 112 may have a net dopant concentration that is lower than the buried layer 110 and the substrate region 104. For example, the low-doped region 112 may have a dopant concentration of no greater than $10^{15}$ dopant atoms/cm$^3$ and more typically in the range of $10^{11}$ dopant atoms/cm$^3$ to $10^{13}$ dopant atoms/cm$^3$, which may correspond to the intrinsic dopant concentration of semiconductor material that is not intentionally doped. The low-doped region 112 may have either a first conductivity type (e.g., n-type) or a second conductivity type (e.g., p-type) opposite from the first conductivity type. The low-doped region 112 may be an epitaxial region of semiconductor material, e.g., silicon, that is formed on top of the substrate region 104 by an epitaxy process. The buried layer 110 may correspond to a portion of the epitaxial material which forms the low-doped region 112 and is more heavily doped by a specific doping process. Alternatively, buried layer 110 may correspond to a part of the substrate region 104 that is created by a doping process.

The overvoltage protection device 100 comprises an interlayer dielectric 114 disposed on the upper surface 106 of the semiconductor body 102. The interlayer dielectric 114 can comprise passivation materials and/or electric isolation materials. For example, the interlayer dielectric 114 can comprise $SiO_2$ (silicon dioxide), $Si_3N_4$ (silicon nitride), $SiO_xNy$ (silicon oxynitride), etc. The interlayer dielectric 114 can comprise multiple layers of the same or different material.

The overvoltage protection device 100 comprises first and second contact pads 116, 118 disposed over the upper surface 106 of the semiconductor body 102. As shown, the first and second contact pads 116, 118 are formed on the interlayer dielectric 114 and are therefore separated from the semiconductor body 102 by the interlayer dielectric 114. The first and second contact pads 116, 118 may each be formed from an electrically conductive material, e.g., copper, aluminum, nickel, and alloys thereof. The first and second contact pads 116, 118 may be configured as externally accessible points of electrical contact that can be contacted by an interconnect structure such as a bond wire, clip, ribbon, solder etc.

The overvoltage protection device 100 comprises a conductive interconnect layer 120 and conductive vias 122 disposed within the interlayer dielectric 114. The conductive interconnect layer 120 may be formed on the upper surface 106 of the semiconductor body 102 and comprises an electrically conducive material such as copper, aluminum or highly doped polysilicon. The conductive interconnect layer 120 is structured into pad regions that are used to form lower-level electrical interconnect and/or to effectuate a vertical connection through the interlayer dielectric 114. The conductive vias 122 may be trenched contact structures in the interlayer dielectric 114 that are filled with a conductive material, e.g., tungsten, aluminum, copper, polysilicon, etc. As shown, the conductive interconnect layer 120 and conductive vias 122 are used in combination to provide a vertical electrical connection between the upper surface 106 of the semiconductor body 102 and the first and second contact pads 116, 118.

The overvoltage protection device 100 comprises a vertical voltage blocking device 124 formed in the semiconductor body 102. The vertical voltage blocking device 124 comprises a first voltage blocking device 126 and a second voltage blocking device 128. The first voltage blocking device 126 comprises a first doped region 130 that extends from the upper surface 106 of the semiconductor body 102 into the low-doped region 112 and a first buried doped region 132 that is arranged between the low-doped region 112 and the buried layer 110. The first doped region 130 may be a first conductivity type region (e.g., n-type) with a net dopant concentration of between $10^{17}$ dopant atoms/cm$^3$ to $10^{20}$ dopant atoms/cm$^3$, for example. The first buried doped region 132 may be a second conductivity type region (e.g., p-type) with a net dopant concentration of at least $10^{15}$ dopant atoms/cm$^3$ and more typically in the range of $10^{17}$ dopant atoms/cm$^3$ to $10^{19}$ dopant atoms/cm$^3$, for example. The second voltage blocking device 128 comprises a second doped region 134 that extends from the upper surface 106 of the semiconductor body 102 into the low-doped region 112 and a second buried doped region 136 that is arranged between the low-doped region 112 and the buried layer 110. The second doped region 134 may be a second conductivity type region (e.g., p-type) with a net dopant concentration of between $10^{17}$ dopant atoms/cm$^3$ to $10^{20}$ dopant atoms/cm$^3$, for example. The second buried doped region 136 may be a first conductivity type region (e.g., n-type) with a net dopant concentration of at least $10^{15}$ dopant atoms/cm$^3$ and more typically in the range of $10^{17}$ dopant atoms/cm$^3$ to $10^{19}$ dopant atoms/cm$^3$, for example.

The first and second voltage blocking devices 126, 128 are each connected between the second contact pad 118 and the substrate region 104 in an antiparallel configuration, meaning that the first voltage blocking device 126 is forward biased while the second voltage blocking device 128 is reverse biased, and vice-versa. The first voltage blocking device 126 is arranged to conduct a vertical current 138 flowing from the substrate region 104 to the second contact pad 118. The second voltage blocking device 128 is arranged to conduct a vertical current 140 flowing from the second contact pad 118 to the substrate region 104.

The overvoltage protection device 100 comprises trenched connectors 142 formed in the semiconductor body 102. The trenched connectors 142 each comprise a trench 144 that is formed in the upper surface 106 of the semiconductor body 102 and extends to the substrate region 104, and a metal electrode 146 disposed within the trench 144. The metal electrode 146 may be formed from or comprise tungsten, aluminum, copper, nickel, etc., and other highly conductive metals, for example. The metal electrode 146 forms an electrically conductive connection between the first contact pad 116 and the substrate region 104. That is, the metal electrode 146 provides a low resistance ohmic connection for current flow between the first contact pad 116 and the substrate region 104. As can be seen, the metal electrode 146 may contact a structured part of the interconnect layer 120, which in turn is electrically connected to the first contact pad 116.

According to an embodiment, the trenched connectors 142 comprise a doped sidewall region 148 lining sidewalls of the trench 144. The doped sidewall region 148 may be a first conductivity type region (e.g., n-type) with a relatively high dopant concentration, e.g., a net dopant concentration of between $10^{18}$ dopant atoms/cm$^3$ and $10^{21}$ dopant atoms/cm$^3$. This facilitates a low-ohmic connection between the metal electrode 146 and the substrate region 104. Generally speaking, the trench 144 can be formed by a variety of techniques including wet or dry etching techniques. The doped sidewall region 148 may be created by implanting dopant atoms into a sidewall and bottom of the trench 144 after formation of the trench 144, for example.

The overvoltage protection device 100 comprises electrical isolation structures 150 that extend from the upper surface 106 of the semiconductor body 102 into the substrate region 104. The electrical isolation structures 150 surround and laterally electrically isolate the first voltage blocking device 126 and the second voltage blocking device 128 such that the vertical current 138 of the first voltage blocking device 126 flows through a first laterally isolated region of the semiconductor body 102 and such that the vertical current 140 of the second voltage blocking device 128 flows through a second laterally isolated region of the semiconductor body 102. That is, the electrical isolation structures 150 form an enclosure around the active regions of the first voltage blocking device 126 and the second voltage blocking device 128. As a result, the vertical current 138 and the vertical current 140 are laterally isolated from potentially interfering fields and/or currents within laterally adjacent regions of the semiconductor body 102

In the depicted embodiment, the electrical isolation structures 150 are provided by a plurality of isolation trenches 152 that extend from the upper surface 106 of the semiconductor body 102 into the substrate region 104. The isolation trenches 152 are at least partially filled by or lined with an electrically insulating material. For example, the isolation trenches 152 can comprise silicon-based insulators such as $SiO_2$ (silicon dioxide), $Si_3N_4$ (silicon nitride), $SiO_xNy$ (silicon oxynitride), etc. The isolation trenches 152 can be completely filled by the electrically insulating material. Alternatively, the isolation trenches 152 can comprise a conductive structure such as a metal or highly doped polysilicon that is separated from the adjacent semiconductor body 102 by dielectric material. These conductive structures can be configured as an electrical shielding element, for example.

Figure 2:
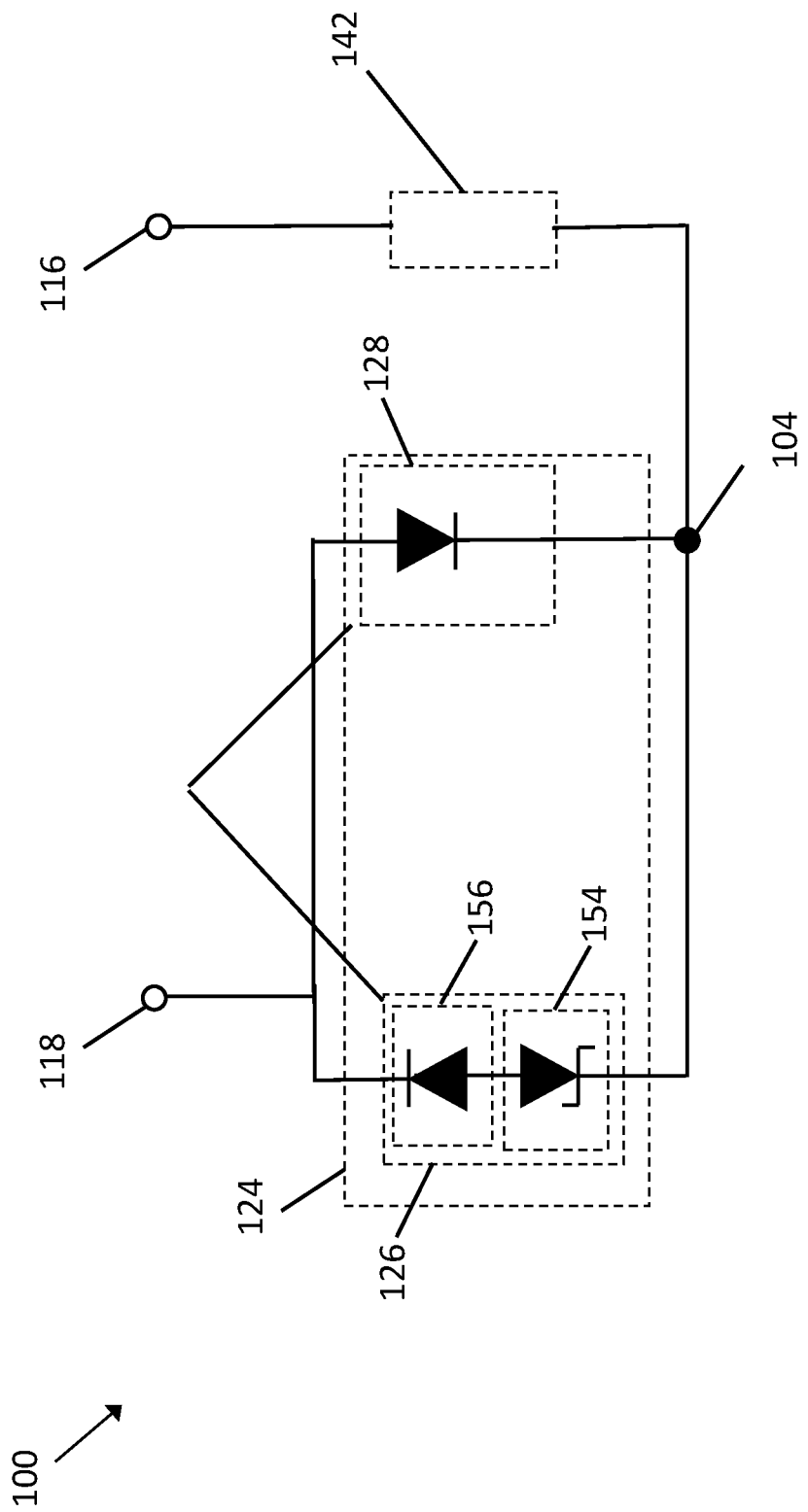
FIG. 2 depicts an equivalent circuit schematic of the overvoltage protection device of FIG. 1, according to an embodiment.

Referring to FIG. 2, an equivalent circuit schematic of the overvoltage protection device 100 is shown. The substrate region 104 forms a node of the circuit that is connected to the vertical voltage blocking device 124 and the trenched connector 142. The first voltage blocking device 126 comprises a blocking diode 154 and a forward diode 156 arranged in an anti-serial configuration. These devices result from an open base bipolar transistor (i.e., an NPN structure or a PNP structure) that is realized by the combination of the buried layer 110, the first buried doped region 132, the portion of the low-doped region 112 arranged between the first buried doped region 132 and the first doped region 130. The blocking diode 154 may correspond to a p-n junction between the buried layer 110 and the first buried doped region 132. The forward diode 156 may correspond to the combination of the first doped region 130, the first buried doped region 132, and an intervening part of the low-doped region 112, which collectively can be regarded as a PIN diode. A PIN diode refers to a type of diode that comprises an intrinsic semiconductor region, e.g., a region of relatively low doped or undoped doped semiconductor material, interposed between a p-type anode region and an n-type cathode region. Meanwhile, the second voltage blocking device 128 results from a PIN diode that corresponds to the combination of the second buried doped region 136, the portion of the low-doped region 112 arranged between the second buried doped region 136 and the second doped region 134, and the second doped region 134. In the case of the second voltage blocking device 128.

The working principle of the overvoltage protection device 100 is as follows. The vertical voltage blocking device 124 and the trenched connector 142 collectively form a unidirectional voltage clamping device between the first and second contact pads 116, 118. A unidirectional voltage clamping device refers to a device wherein the clamping voltage is different in a forward bias direction than in a reverse bias direction. In this device, the negative clamping voltage of the device at a negative bias between the first and second contact pads 116, 118 is defined by the second voltage blocking device 128. When the negative bias between the first and second contact pads 116, 118 exceeds the forward conduction voltage of the second voltage blocking device 128, the second voltage blocking device 128 conducts the vertical current 140 flowing from the second contact pad 118 to the substrate region 104, and the trenched connector 142 forms a conduction path for this current to flow from the substrate region 104 to the first contact pad 116. The positive clamping voltage of the unidirectional voltage clamping device at a positive bias between the first and second contact pads 116, 118 is defined by the first voltage blocking device 126. When the positive bias between the first and second contact pads 116, 118 exceeds the reverse conduction voltage of the first voltage blocking device 126 and the forward conduction voltage of the forward diode 156, the first voltage blocking device 126 becomes conductive. In this state, the first voltage blocking device 126 conducts the vertical current 138 flowing from the substrate region 104 to the second contact pad 118, and the trenched connector 142 forms a conduction path for this current to flow from the first contact pad 116 to the substrate region 104.

Figure 3:
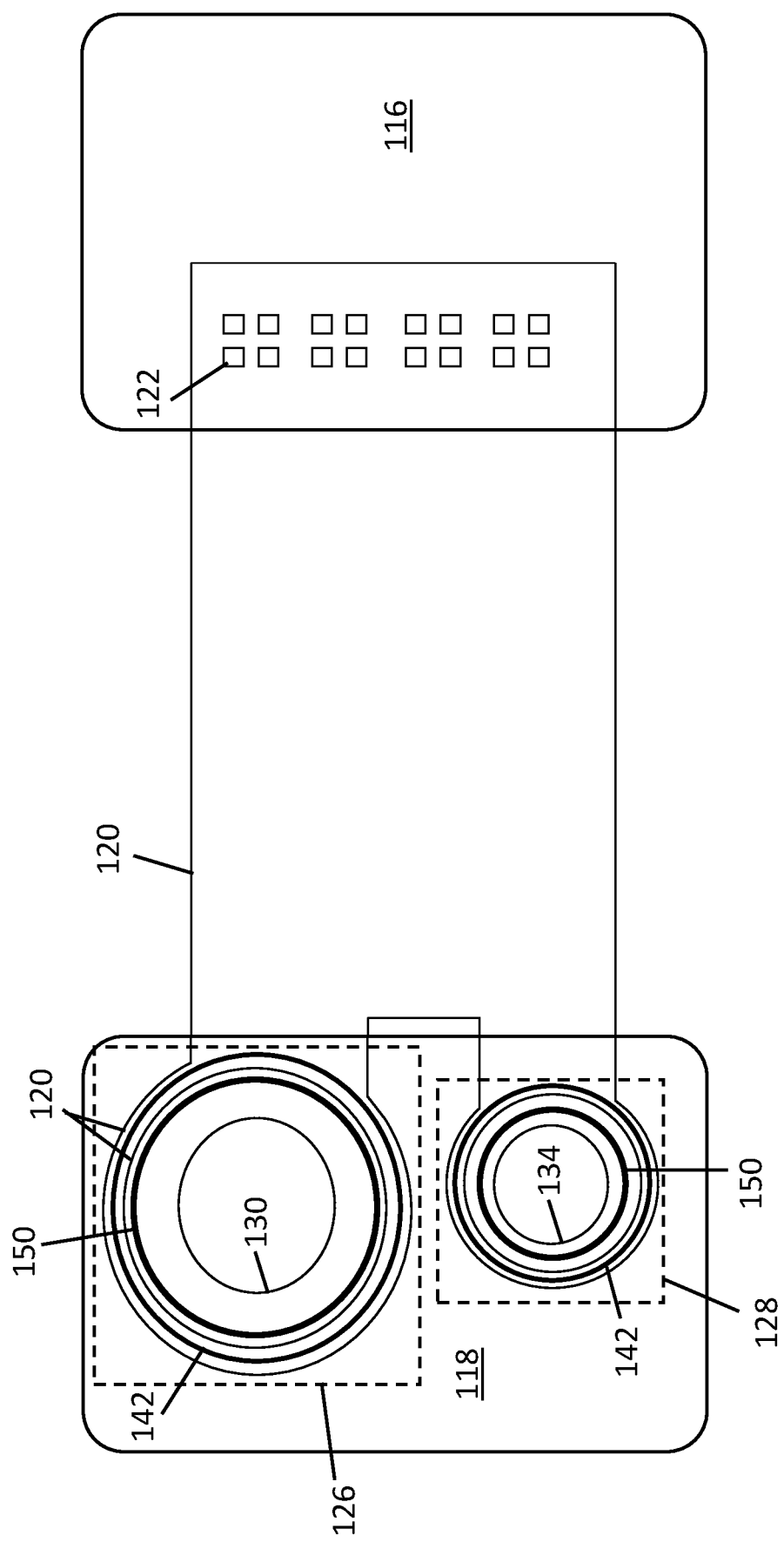
FIG. 3 depicts a plan-view of the overvoltage protection device of FIG. 1, according to an embodiment.

Referring to FIG. 3, a plan-view layout of the overvoltage protection device 100 is shown, according to an embodiment. In this arrangement, the first and second voltage blocking devices 126, 128 are configured such that the active regions of these devices form an enclosed area that is underneath the second contact pad 118. These active regions are enclosed by circular shaped electrical isolation structures 150, thus forming circular isolated portions of the semiconductor body 102 for the first and second vertical currents 138, 150 to flow between the second contact pad 118 and the substrate region 104. The trenched connectors 142 are formed to enclose the circular shaped electrical isolation structures 150 with a similar circular geometry. As can be seen, the trenched connectors 142 can be formed in very close proximity to the active areas of the first and second voltage blocking devices 126, 128. For example, a separation distance between the electrical isolation structures 150 and the trenched connector 142 may correspond to a minimum dimension of the processing techniques (e.g., trench formation) used to form the trenched connector 142 and the electrical isolation structures 150. The electrical connection between the metal electrodes 146 of the trenched connector 142 and the first contact pad 116 may be effectuated using a structured span of the conductive interconnect layer 120 that forms a ring over the metal electrodes 146 and extends from underneath the second contact pad 118 from underneath the first contact pad 116. The layout shown in FIG. 3 advantageously minimizes the lateral portion of the substrate region 104 that current must flow between the first and second voltage blocking devices 126, 128 and the trenched connector 142, thereby lowering the electrical resistance and capacitance of the device.

Figure 4:
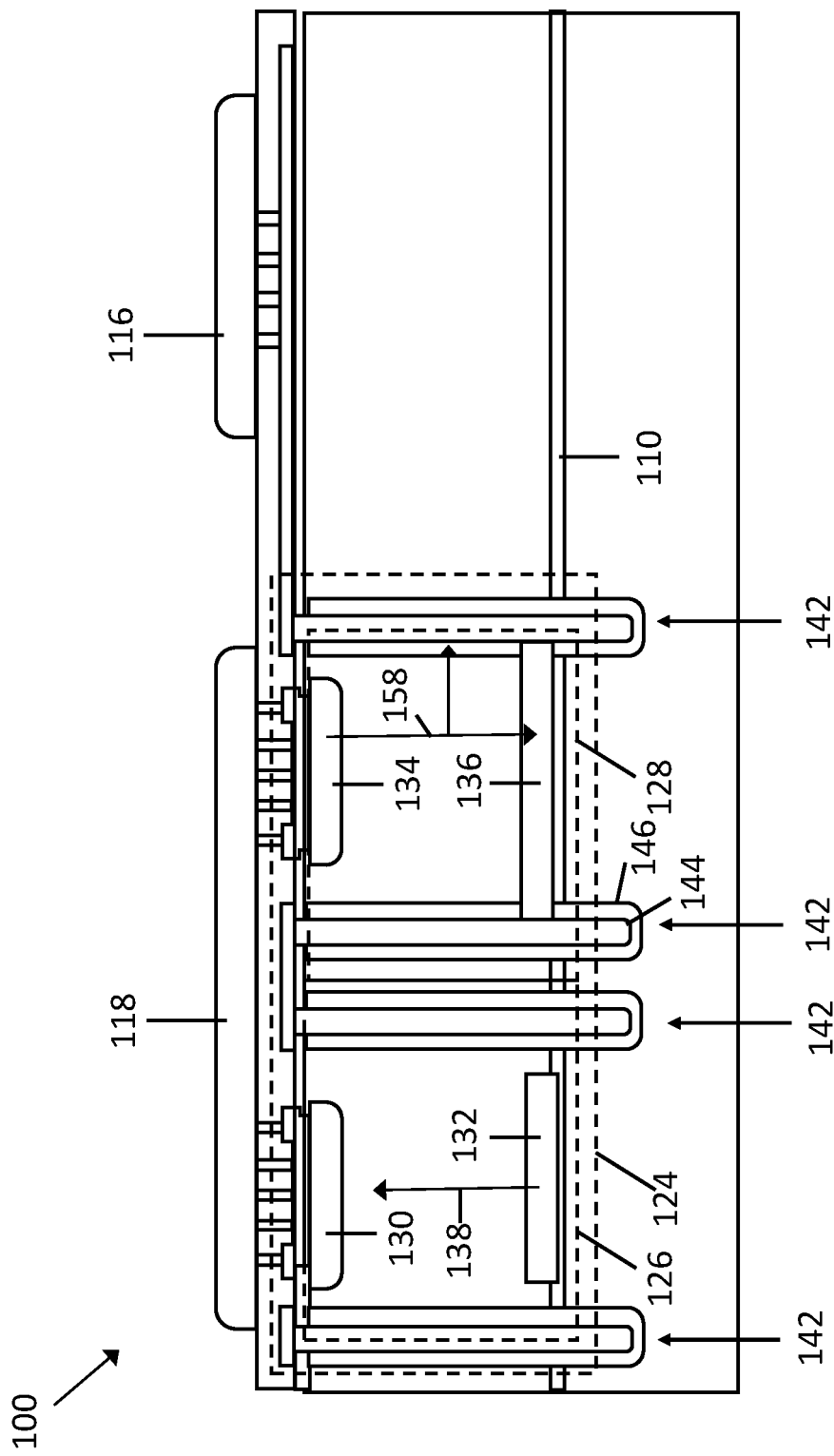
FIG. 4 depicts a cross-sectional view of an overvoltage protection device, according to another embodiment.

Referring to FIG. 4, an overvoltage protection device 100 is shown, according to another embodiment. The overvoltage protection device 100 may have the following differences from the embodiment described with reference to FIG. 1. In this embodiment, the electrical isolation structures 150 are replaced by the trenched connectors 142. That is, the trenched connectors 142 serve a dual role. First, the trenched connectors 142 serve their previously described function of providing the electrical connection between the substrate region 104 and the first contact pad 116. The trenched connectors 142 provide electrical isolation for the first and second voltage blocking devices 126, 128 akin to the electrical isolation structures 150 as previously described. The electrodes 146 of the trenched connectors 142 may serve as shielding structures to provide this electrical isolation.

In the embodiment of FIG. 4, the first voltage blocking device 126 can operate in the same way as the embodiment of FIG. 1, i.e., as an open base bipolar transistor connected between the second contact pad 118 and the substrate region 104. As can be seen, a separation distance is provided between the first buried doped region 132 and the doped sidewall region 148 of the trenched connectors 142. This ensures that the p-n junction between the first buried doped region 132 and the buried layer 110 effectively operates as the blocking diode 154.

In the embodiment of FIG. 4, the second voltage blocking device 128 can operate in the same way as the embodiment of FIG. 1, i.e., as a PIN diode, with the following exception. Instead of having a vertical current 140 that flows exclusively in a vertical direction, the second voltage blocking device 128 is configured to conduct a multi-directional current 158 in a forward conduction mode of the device. This multi-directional current 158 comprises a vertical component that flows into the second buried doped region 136 in a similar manner as described above. Additionally, this multi-directional current 158 comprises a lateral component that flows laterally across the across sidewalls of the connection trench 144 and into the metal electrode 146. This multi-directional current 158 results from the fact that the doped sidewall regions 148 of the trenched connectors 142 adjoining the second voltage blocking device 128 have the same conductivity type as the second buried doped region 136 and thus form an extension of the second buried doped region 136. Thus, the effective area from which carriers can flow into an active region of the device (in this example the cathode of the PIN diode) is increased.

A semiconductor device that comprises the trenched connector 142 with the doped sidewall regions 148 as an active region of the device that conducts an operational current of the device may have a variety of different configurations in addition to the specific overvoltage protection device embodiments described herein. Examples of devices that may comprise the trenched connector 142 include without being limited to: a Zener diode, an open base bipolar transistor (i.e., an NPN or PNP structure), an open base thyristor (i.e., an NPNP or PNPN structure), a vertical MOSFET device, a vertical DMOS device, PIN diode, a PN diode, etc. In each case, a favorable increase to the effective area of the device can be realized by using the doped sidewall regions 148 as a substitute for or in combination with an active device region that conducts an operational current. Separately or in combination, the doped sidewall regions 148 may have multiple different regions of different conductivity type, e.g., alternating regions of p-type and n-type, so as to realize multiple active device regions as part of the trenched connector 142.

Figure 5:
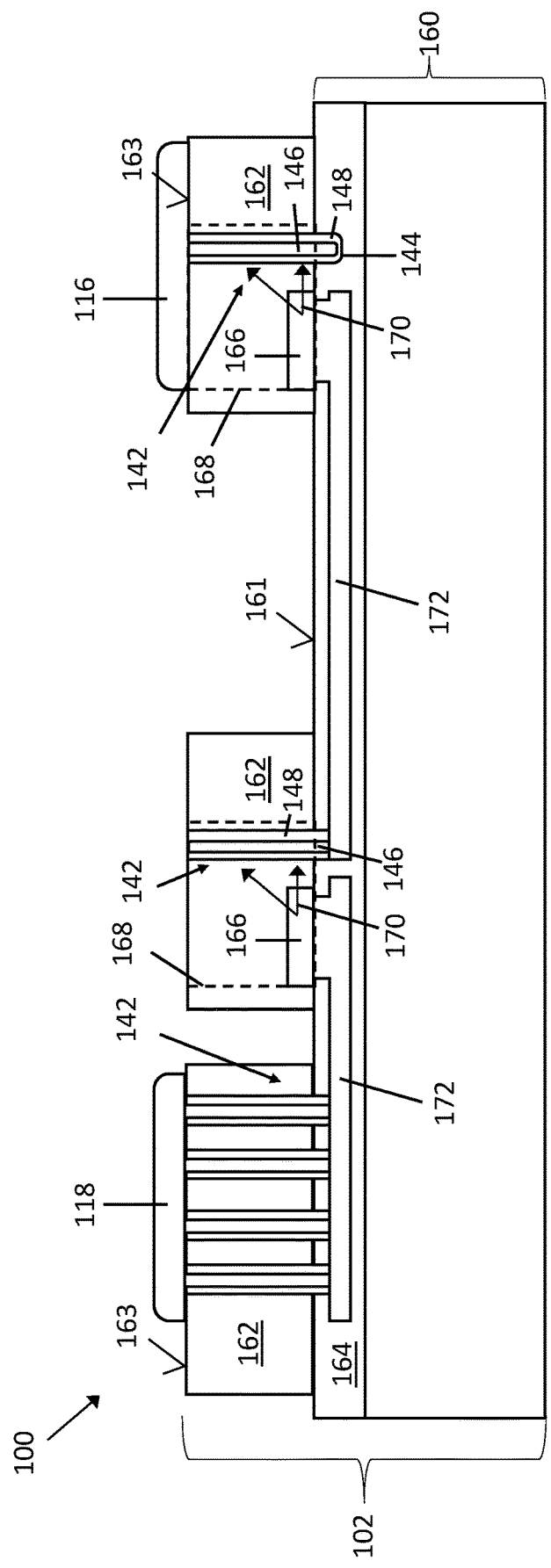
FIG. 5 depicts a cross-sectional view of an overvoltage protection device, according to another embodiment.

Referring to FIG. 5, an overvoltage protection device 100 is depicted, according to an embodiment. The overvoltage protection device 100 may have the following differences from the embodiments described with references to FIGS. 1 and 4. The overvoltage protection device 100 in the embodiment of FIG. 5 comprises a semiconductor body 102 that comprises a base region 160 and a plurality of semiconductor mesas 162 disposed on an upper surface 161 of the base region 160. The base region 160 may comprise semiconductor materials such as, silicon (Si) and germanium (Ge), silicon carbide (SiC), etc. The base region 160 may comprise a bulk wafer, such as a silicon wafer, for example, with one or more semiconductor layers and/or dielectric layers disposed thereon. Separately or in combination, the base region 160 may comprise other electrical insulators, e.g., glass materials, molded epoxy material, resins, etc. As shown, the base region 160 comprises a dielectric layer 164 that extends to the upper surface 161 of the base region 160. The dielectric layer 164 may comprise an insulator such as $SiO_2$, $Si_3N_4$, $SiO_xNy$, etc. The semiconductor mesas 162 are regions of semiconductor material that are formed on the base region 160 and are laterally isolated from one another by open regions. For example, the semiconductor mesas 162 may be formed by bonding one or more active semiconductor wafers onto a carrier. The active semiconductor wafers may be etched and/or multiple active semiconductor wafers may be bonded.

The overvoltage protection device 100 comprises first and second contact pads 116, 118 that are disposed on upper surfaces 163 of two separate ones of the semiconductor mesas 162. In the depicted embodiment, the first contact pad 116 is disposed on the upper surface of a first one of the mesas 162 and the second contact pad 118 is disposed on the upper surface 162 of a second mesa 162 that is laterally spaced apart from the first mesa 162.

The overvoltage protection device 100 comprises a plurality of doped regions 166 that are formed in lower regions of the semiconductor mesas 162. The doped regions 166 are formed at lower surfaces of the semiconductor mesas 162 that face the base region 160. In the cross-sectional perspective of FIG. 5, the first one of the mesas 162 that comprises the first contact pad 116 disposed thereon comprises one of the doped regions 166 and a third one of the mesas 162 that is laterally between the first and second mesas 162 comprises one of the doped regions 166. The doped regions 166 have a higher net dopant concentration than the adjacent semiconductor material within the semiconductor mesas 162. For example, the semiconductor mesas 162 may have an underlying dopant concentration of no greater than $10^{15}$ dopant atoms/cm$^3$ and more typically in the range of $10^{11}$ dopant atoms/cm$^3$ to $10^{13}$ dopant atoms/cm$^3$, which may correspond to the intrinsic dopant concentration of semiconductor material that does not receive active or intentional doping processes. By contrast, the doped regions 166 may have a dopant concentration of between $10^{18}$ dopant atoms/cm$^3$ to $10^{21}$ dopant atoms/cm$^3$, for example.

The overvoltage protection device 100 comprises a plurality of the trenched connectors 142 formed in the semiconductor mesas 162. In a similar manner as described in the previous embodiments, the trenched connectors 142 comprise a trench 144 that is formed in an upper surface of the semiconductor mesas 162 and extends to the base region 160, a metal electrode 146 disposed within the trench 144, and a doped sidewall region 148 lining sidewalls of the trench 144.

Some of the trenched connectors 142 of the overvoltage protection device 100 form voltage blocking devices 168 with the doped regions 166. In the cross-sectional perspective of FIG. 5, the trenched connectors 142 in the first one of the mesas 162 that comprises the first contact pad 116 disposed thereon form a voltage blocking device 168 and the trenched connectors 142 in the third one of the mesas 162 that is laterally between the first and ones of the second mesas 162 form a voltage blocking device 168. In these voltage blocking devices 168, the doped regions 166 and the doped sidewall regions 148 may form the anode and cathode regions of the voltage blocking devices 168 (or vice-versa). To this end, the doped regions 166 may have a net first conductivity type (e.g., p-type), and the doped sidewall regions 148 may have a net second conductivity type opposite from the first conductivity type (e.g., n-type). The regions of the semiconductor mesas 162 between the doped regions 166 and the doped sidewall regions 148 may be relatively low-doped regions of the first or second conductivity type that form an intrinsic region of a PIN diode. The voltage blocking devices 168 configured as PIN diodes in this arrangement are configured to conduct a multi-directional current 170. In a forward conduction state of the voltage blocking device 168, the multi-directional current 170 flows laterally between the doped regions 166 and the doped sidewall regions 148 and spreads vertically from the lower region of the mesas 162 to higher parts of the trenched connectors 142 along the sidewalls of the trenches 144. This arrangement favorably increases to the effective area of the device in a similar manner as described above. The above-described of the doped regions 166 and the trenched connectors 142 may form a unit cell such that any number of PIN diodes, e.g., two, three, four, etc. may be connected between the first and second contact pads 116, 118.

Some of the trenched connectors 142 of the overvoltage protection device 100 are used as connection elements for electrically connecting the voltage blocking devices 168 to the first and second contact pads 116, 118. As shown, the first semiconductor mesa 162 that comprises the second contact pad 118 disposed thereon comprises trenched connectors 142 that are used to electrically connect the second contact pad 118 to the base region 160. The metal electrode 146 of the trenched connectors 142 forms a low-ohmic contact with a buried metallization layer 172 that is disposed within the dielectric layer 164. The buried metallization layer 172 is structured into interconnect lines that facilitate electrical connection between the different semiconductor mesas 162.

Figure 6:
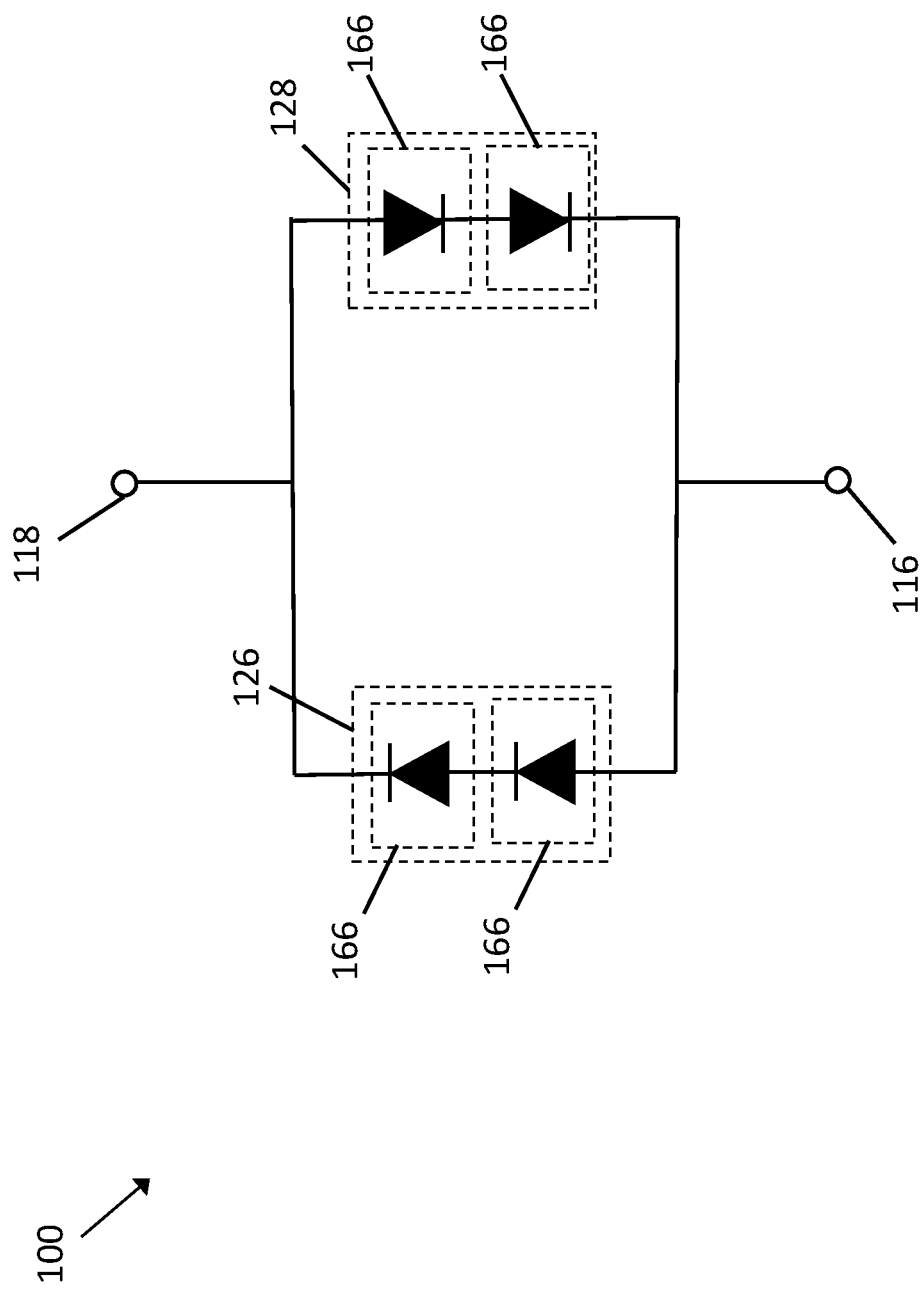
FIG. 6 depicts an equivalent circuit schematic of the overvoltage protection device of FIG. 5, according to an embodiment.

Referring to FIG. 6, an equivalent electrical schematic of the overvoltage protection device 100 from FIG. 5 is shown. The first contact pad 116 forms a first node of the circuit and the second contact pad 118 forms a second node of the circuit. The circuit comprises a first voltage blocking device 126 and a second voltage blocking device 128 connected between the first and second contact pads 116, 118 in an antiparallel configuration. The first and second voltage blocking devices 126, 128 each comprise a pair of the voltage blocking devices 168 formed by the trenched connectors 142 as shown in FIG. 5. A forward clamping voltage of the overvoltage protection device 100 at a positive bias between the first and second contact pads 116, 118 is determined by a forward conduction voltage of the first voltage blocking device 126. A negative clamping voltage of the overvoltage protection device 100 at a negative bias between the first and second contact pads 116, 118 is determined by a conduction voltage of the second voltage blocking device 128. According to an embodiment, the overvoltage protection device 100 is a bidirectional device such that the positive and negative clamping voltages are the same.

Figure 7:
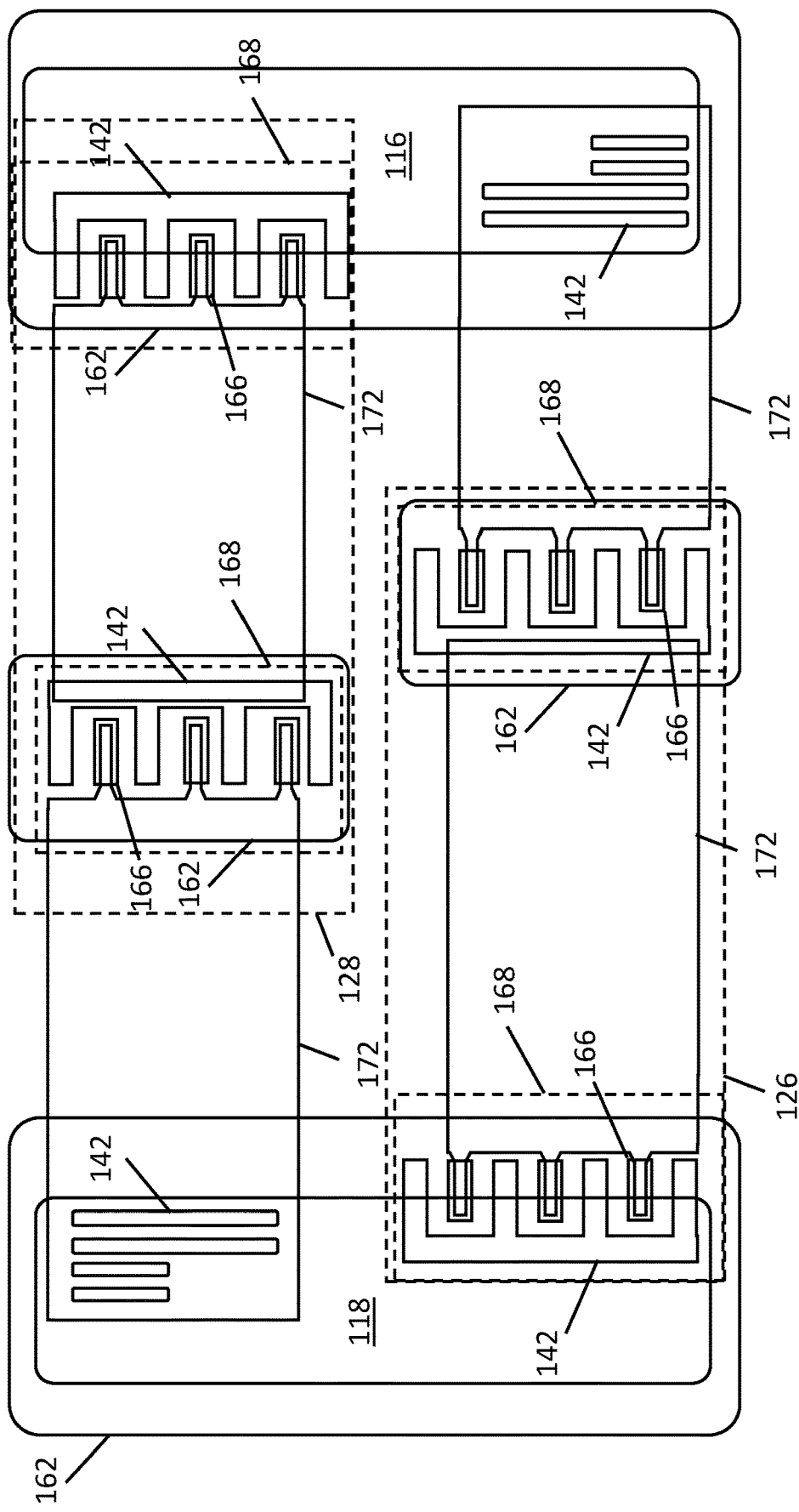
FIG. 7 depicts a plan-view of the overvoltage protection device of FIG. 5, according to an embodiment.

Referring to FIG. 7, a plan-view layout of the overvoltage protection device 100 is shown, according to an embodiment. The overvoltage protection device 100 comprises third and fourth ones of the semiconductor mesas 162 that are laterally between the first and second ones of the semiconductor mesas 162 which comprise the first and second contact pads 116, 118 disposed thereon 142. Each of the third and fourth ones of the semiconductor mesas 162 comprise one of the voltage blocking devices 168 formed by the trenched connectors 142 as shown in FIG. 6. Additionally, one of the voltage blocking devices 168 formed by the trenched connectors 142 as shown in FIG. 6 is formed in each one of the first and second ones of the semiconductor mesas 162 which comprise the first and second contact pads disposed thereon 142. Structured regions of the buried metallization layer 172 are used to provide the electrical connection between separate mesas 162. As a result, the first and second voltage blocking devices 126, 128 are realized by two sets of series connected voltage blocking devices 168 connected between the first and second contact pads 116, 118.

As can be seen, the voltage blocking devices 168 are realized by a layout comprising a plurality of the doped regions 166, wherein each of these doped regions 166 have an elongated geometry and run parallel to one another. The trenched connectors 142 are arranged to have fingers with an elongated geometry that are interleaved between immediately adjacent ones of the doped regions 166. As a result, when the diodes are in a forward conduction mode, a multi-directional current 170, i.e., a current that flows in more than one direction, spreads laterally away from the doped regions 166 in multiple directions, thereby increasing the effective area of the device.

Although the present disclosure is not so limited, the following numbered examples demonstrate one or more aspects of the disclosure.

Example 1. An overvoltage protection device, comprising: a semiconductor body comprising a substrate region disposed beneath an upper surface of the semiconductor body; first and second contact pads disposed over the upper surface of the semiconductor body; a trenched connector formed in the semiconductor body, a vertical voltage blocking device formed in the semiconductor body, wherein the trenched connector comprises a trench that is formed in the upper surface of the semiconductor body and extends to the substrate region, and a metal electrode disposed within the trench, wherein the metal electrode forms an electrically conductive connection between the first contact pad and the substrate region, and wherein the voltage blocking device is connected between the second contact pad and the substrate region.

Example 2. The overvoltage protection device of example 1, wherein the trenched connector further comprises a doped sidewall region lining sidewalls of the trench, and wherein the metal electrode directly adjoins the doped sidewall region and is in low-ohmic contact with the substrate region via the doped sidewall region.

Example 3. The overvoltage protection device of example 2, wherein the vertical voltage blocking device comprises a first voltage blocking device and a second voltage blocking device, wherein the first and second voltage blocking devices are connected between the second contact pad and the substrate region in an antiparallel configuration, wherein the first voltage blocking device is arranged to conduct a vertical current flowing from the substrate region to the second contact pad, wherein the second voltage blocking device is arranged to conduct a vertical current flowing from the second contact pad to the substrate.

Example 4. The overvoltage protection device of example 3, wherein the semiconductor body comprises a low-doped region and a buried layer, wherein the buried layer is arranged between the substrate region and the low-doped region, wherein the low-doped region is arranged between the buried layer and the upper surface of the semiconductor body, and wherein buried layer has the same conductivity type as the substrate region and has a lower net dopant concentration than the substrate region.

Example 5. The overvoltage protection device of example 4, wherein the first voltage blocking device comprises a first doped region that extends from the upper surface of the semiconductor body into the low-doped region and a first buried doped region that is arranged between the low-doped region and the buried layer, wherein the second voltage blocking device comprises a second doped region that extends from the upper surface of the semiconductor body into the low-doped region and a second buried doped region that is arranged between the low-doped region and the buried layer.

Example 6. The overvoltage protection device of example 3, wherein the overvoltage protection device comprises electrical isolation structures that extend from the upper surface of the semiconductor body into the substrate region, wherein the electrical isolation structures surround and laterally electrically isolate the first voltage blocking device and the second voltage blocking device such that the current of the first voltage blocking device flows through a first laterally isolated region of the semiconductor body and such that the current of the second voltage blocking device flows through a second laterally isolated region of the semiconductor body.

Example 7. The overvoltage protection device of example 6, wherein the electrical isolation structures are separate from the trenched connector.

Example 8. The overvoltage protection device of example 6, wherein the electrical isolation structures comprise the trenched connector.

Example 9. The overvoltage protection device of example 8, wherein the trenched connector that surrounds and laterally electrically isolates the second voltage blocking device is arranged such that the second vertical current flows across sidewalls of the connection trench.

Example 10. An overvoltage protection device, comprising a semiconductor body comprising a substrate region disposed beneath an upper surface of the semiconductor body; first and second contact pads disposed over the upper surface of the semiconductor body; a trenched connector electrically connected between the first contact pad and the substrate region; and a unidirectional voltage clamping device formed in the semiconductor body and connected between the second contact pad and the substrate region.

Example 11. The overvoltage protection device of example 10, wherein the trenched connector comprises a trench that is formed in the upper surface of the semiconductor body and extends to the substrate region, a metal electrode disposed within the trench, and a doped sidewall region lining sidewalls of the trench, and wherein the metal electrode directly adjoins the doped sidewall region and is in low-ohmic contact with the substrate region via the doped sidewall region.

Example 12. The overvoltage protection device of example 11, wherein the unidirectional voltage clamping device comprises a first voltage blocking device and a second voltage blocking device, wherein the first and second voltage blocking devices are connected between the second contact pad and the substrate region in an antiparallel configuration, wherein a negative clamping voltage of the unidirectional device at a negative bias between the first and second contact pads is defined by the second voltage blocking device, and wherein a positive clamping voltage of the unidirectional device at a positive bias between the first and second contact pads is defined by the first voltage blocking device.

Example 13. The overvoltage protection device of example 12, wherein the first voltage blocking device is an open base bipolar transistor, and wherein the second voltage blocking device is a PIN diode.

Example 14. The overvoltage protection device of example 13, wherein the trenched connector is arranged immediately adjacent to an intrinsic region of the PIN diode such that a forward current of the PIN diode flows across sidewalls of the trench.

Example 15. An overvoltage protection device, comprising: a semiconductor body comprising a base region and a plurality of semiconductor mesas disposed on an upper surface of the base region; first and second contact pads disposed on upper surfaces of separate ones of the semiconductor mesas; a plurality of doped regions formed at lower surfaces of the semiconductor mesas, the lower surfaces of the semiconductor mesas facing the base region; and a plurality of trenched connectors formed in the semiconductor mesas, wherein each of the trenched connectors comprise a trench that is formed in an upper surface of the semiconductor mesas and extends to the base region, a metal electrode disposed within the trench, and a doped sidewall region lining sidewalls of the trench, wherein the doped regions and the trenched connectors collectively form a first voltage blocking device between the first and second contact pads.

Example 16. The overvoltage protection device of example 15, wherein the plurality of doped regions each have an elongated geometry and run parallel to one another, wherein the trenched connectors are interleaved between immediately adjacent ones of the doped regions.

Example 17. The overvoltage protection device of example 16, wherein the plurality of doped regions and the trenched connectors form a PIN diode connected between the first and second contact pads, and wherein regions of the semiconductor mesas between the doped regions and the doped sidewall regions form the intrinsic region of the PIN diode.

Example 18. The overvoltage protection device of example 16, wherein in a forward conduction state of the first voltage blocking device current flows in multiple directions in the semiconductor mesas across sidewalls of the trench from the trenched connectors.

Example 19. The overvoltage protection device of example 15, wherein the first contact pad is disposed on a first one of the mesas, wherein the second contact pad is disposed on a second one of the mesas, wherein at least some of the trenched connectors and the doped regions are disposed in a third one of the mesas that is between the first and second ones of the mesas.

Example 20. The overvoltage protection device of example 15, wherein the doped regions and the doped sidewall regions are collectively arranged to form a second voltage blocking device between the first and second contact pads, wherein the first and second voltage blocking devices are arranged in an antiparallel configuration.

A "lateral" device as used herein refers to semiconductor device which conducts an operational current exclusively in a lateral direction that is parallel to a main or upper surface of a semiconductor substrate. By contrast, a "vertical" device as used herein refers to semiconductor device which conducts an operational current that flows at least partially in a vertical direction that is parallel to a main or upper surface of a semiconductor substrate. Vertical devices include devices that conduct operational current that flows with a lateral component and with a vertical component simultaneously.

The term "low-ohmic contact" or "low-ohmic connection" intends to describe a non-rectifying electrical contact or connection between two elements, e.g., a contact or connection wherein electrical current may flow with low electrical resistance in both directions. By contrast, a non-ohmic contact or non-ohmic connection intends to describe a contact or connection with non-linear I-V characteristics.

The semiconductor body disclosed herein may include or consist of a semiconductor material from group IV elemental semiconductors, IV-IV compound semiconductor material, III-V compound semiconductor material, Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs).

The present specification refers to a "first" and a "second" conductivity type of dopants. These terms refer to the majority carrier type of doped semiconductor regions. The present specification also refers to n-type semiconductor regions, i.e., semiconductor regions with a net n-type majority carrier concentration, and p-type semiconductor regions, i.e., semiconductor regions with a net p-type majority carrier concentration. In any of the embodiments described herein, the doping types may be reversed to obtain a device that operates on a similar working principle. For example, an n-type device may be converted to a p-type device by changing the n-type regions to p-type regions, and vice-versa. The polarity of any diode structure may be reversed by changing the n-type regions to p-type regions, and vice-versa. The present specification encompasses all such embodiments.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An overvoltage protection device, comprising:
  a semiconductor body comprising a substrate region disposed beneath an upper surface of the semiconductor body;
  first and second contact pads disposed over the upper surface of the semiconductor body;
  a trenched connector formed in the semiconductor body, a vertical voltage blocking device formed in the semiconductor body and connected between the second contact pad and the substrate region,
  wherein the trenched connector comprises a trench that is formed in the upper surface of the semiconductor body and extends to the substrate region, and a metal electrode disposed within the trench,
  wherein the metal electrode forms an electrically conductive connection between the first contact pad and the substrate region, and
  wherein the substrate region forms an electrically conductive connection between the vertical voltage blocking device and the metal electrode.

2. The overvoltage protection device of claim 1, wherein the trenched connector further comprises a doped sidewall region lining sidewalls of the trench, and wherein the metal electrode directly adjoins the doped sidewall region and is in low-ohmic contact with the substrate region via the doped sidewall region.

3. The overvoltage protection device of claim 2, wherein the vertical voltage blocking device comprises a first voltage blocking device and a second voltage blocking device, wherein the first and second voltage blocking devices are connected between the second contact pad and the substrate region in an antiparallel configuration, wherein the first voltage blocking device is arranged to conduct a vertical current flowing from the substrate region to the second contact pad, wherein the second voltage blocking device is arranged to conduct a vertical current flowing from the second contact pad to the substrate.

4. The overvoltage protection device of claim 3, wherein the semiconductor body comprises a low-doped region and a buried layer, wherein the buried layer is arranged between the substrate region and the low-doped region, wherein the low-doped region is arranged between the buried layer and the upper surface of the semiconductor body, and wherein buried layer has a same conductivity type as the substrate region and has a lower net dopant concentration than the substrate region.

5. The overvoltage protection device of claim 4, wherein the first voltage blocking device comprises a first doped region that extends from the upper surface of the semiconductor body into the low-doped region and a first buried doped region that is arranged between the low-doped region and the buried layer, wherein the second voltage blocking device comprises a second doped region that extends from the upper surface of the semiconductor body into the low-doped region and a second buried doped region that is arranged between the low-doped region and the buried layer.

6. The overvoltage protection device of claim 3, wherein the overvoltage protection device comprises electrical isolation structures that extend from the upper surface of the semiconductor body into the substrate region, wherein the electrical isolation structures surround and laterally electrically isolate the first voltage blocking device and the second voltage blocking device such that the current of the first voltage blocking device flows through a first laterally isolated region of the semiconductor body and such that the current of the second voltage blocking device flows through a second laterally isolated region of the semiconductor body.

7. The overvoltage protection device of claim 6, wherein the electrical isolation structures are separate from the trenched connector.

8. The overvoltage protection device of claim 6, wherein the electrical isolation structures comprise the trenched connector.

9. The overvoltage protection device of claim 8, wherein the trenched connector that surrounds and laterally electrically isolates the second voltage blocking device is arranged such that the second vertical current flows across sidewalls of the connection trench.

10. An overvoltage protection device, comprising:
a semiconductor body comprising a substrate region disposed beneath an upper surface of the semiconductor body;
first and second contact pads disposed over the upper surface of the semiconductor body;
a trenched connector electrically connected between the first contact pad and the substrate region; and
a unidirectional voltage clamping device formed in the semiconductor body and connected between the second contact pad and the substrate region.

11. The overvoltage protection device of claim 10, wherein the trenched connector comprises a trench that is formed in the upper surface of the semiconductor body and extends to the substrate region, a metal electrode disposed within the trench, and a doped sidewall region lining sidewalls of the trench, and wherein the metal electrode directly adjoins the doped sidewall region and is in low-ohmic contact with the substrate region via the doped sidewall region.

12. The overvoltage protection device of claim 11, wherein the unidirectional voltage clamping device comprises a first voltage blocking device and a second voltage blocking device, wherein the first and second voltage blocking devices are connected between the second contact pad and the substrate region in an antiparallel configuration, wherein a negative clamping voltage of the unidirectional device at a negative bias between the first and second contact pads is defined by the second voltage blocking device, and wherein a positive clamping voltage of the unidirectional device at a positive bias between the first and second contact pads is defined by the first voltage blocking device.

13. The overvoltage protection device of claim 12, wherein the first voltage blocking device is an open base bipolar transistor, and wherein the second voltage blocking device is a PIN diode.

14. The overvoltage protection device of claim 13, wherein the trenched connector is arranged immediately adjacent to an intrinsic region of the PIN diode such that a forward current of the PIN diode flows across sidewalls of the trench.

15. An overvoltage protection device, comprising:
a semiconductor body comprising a base region and a plurality of semiconductor mesas disposed on an upper surface of the base region;
first and second contact pads disposed on upper surfaces of separate ones of the semiconductor mesas;
a plurality of doped regions formed at lower surfaces of the semiconductor mesas, the lower surfaces of the semiconductor mesas facing the base region; and
a plurality of trenched connectors formed in the semiconductor mesas,
wherein each of the trenched connectors comprise a trench that is formed in an upper surface of the semiconductor mesas and extends to the base region, a metal electrode disposed within the trench, and a doped sidewall region lining sidewalls of the trench,
wherein the doped regions and the trenched connectors collectively form a first voltage blocking device between the first and second contact pads.

16. The overvoltage protection device of claim 15, wherein the plurality of doped regions each have an elongated geometry and run parallel to one another, wherein the trenched connectors are interleaved between immediately adjacent ones of the doped regions.

17. The overvoltage protection device of claim 16, wherein the plurality of doped regions and the trenched connectors form a PIN diode connected between the first and second contact pads, and wherein regions of the semiconductor mesas between the doped regions and the doped sidewall regions form the intrinsic region of the PIN diode.

18. The overvoltage protection device of claim 16, wherein in a forward conduction state of the first voltage blocking device current flows in multiple directions in the semiconductor mesas across sidewalls of the trench from the trenched connectors.

19. The overvoltage protection device of claim 15, wherein the first contact pad is disposed on a first one of the mesas, wherein the second contact pad is disposed on a second one of the mesas, wherein at least some of the trenched connectors and the doped regions are disposed in a third one of the mesas that is between the first and second ones of the mesas.

20. The overvoltage protection device of claim 15, wherein the doped regions and the doped sidewall regions are collectively arranged to form a second voltage blocking device between the first and second contact pads, wherein the first and second voltage blocking devices are arranged in an antiparallel configuration.

* * * * *

UNITED STATES PATENT AND TRADEMARK OFFICE
CERTIFICATE OF CORRECTION

| | | |
|---|---|---|
| PATENT NO. | : 12,218,084 B2 | |
| APPLICATION NO. | : 17/702342 | |
| DATED | : February 4, 2025 | |
| INVENTOR(S) | : A. Schmenn et al. | |

It is certified that error appears in the above-identified patent and that said Letters Patent is hereby corrected as shown below:

In the Claims

Column 15, Line 15 Claim 4, please change "buried" to -- the buried --.

Signed and Sealed this
First Day of April, 2025

Coke Morgan Stewart
*Acting Director of the United States Patent and Trademark Office*